United States Patent [19]

Legg et al.

[11] Patent Number: 5,007,373
[45] Date of Patent: Apr. 16, 1991

[54] SPIRAL HOLLOW CATHODE

[75] Inventors: Keith O. Legg, Dunwoody, Ga.; Yonhua Tzeng, Auburn, Ala.

[73] Assignee: Ionic Atlanta, Inc., Atlanta, Ga.

[21] Appl. No.: 356,433

[22] Filed: May 24, 1989

[51] Int. Cl.$^5$ .............................. C23C 16/50
[52] U.S. Cl. .................. 118/723; 313/231.41; 315/111.21; 315/111.91; 427/39
[58] Field of Search ............... 118/723; 156/345, 643; 313/231.41; 315/111.21, 111.81, 111.91; 376/144, 145; 427/38, 39

[56] References Cited

U.S. PATENT DOCUMENTS

| 4,087,720 | 5/1978 | Takagi | 315/111.91 |
| 4,339,691 | 7/1982 | Morimiya et al. | 250/426 |
| 4,407,712 | 10/1983 | Henshaw et al. | 118/723 |
| 4,529,571 | 7/1985 | Bacon et al. | 250/427 |
| 4,679,219 | 7/1987 | Ozaki | 378/121 |
| 4,735,633 | 4/1988 | Chiu | 55/154 |
| 4,886,969 | 12/1989 | Knauer | 250/427 |

FOREIGN PATENT DOCUMENTS 58-45718 3/1983 Japan .

OTHER PUBLICATIONS

Bunshah, Roitan F. et al., Deposition Technologies for Films and Coatings, Noyes, New Jersey (1982), pp. 106–108.

Singh, et al., Hollow Cathode Plasma Assisted Chemical Vapor Deposition of Diamond, Applied Physics Letters 52 (20), pp. 1658–1660 (May 16, 1988).

Primary Examiner—Norman Morgenstern
Assistant Examiner—Terry J. Owens
Attorney, Agent, or Firm—Kilpatrick & Cody

[57] ABSTRACT

A spiral hollow cathode having adjacent layers which are equivalent to a two-dimensional array of small hollow cathodes. The cathode may be used for producing large area electron beams and for plasma-assisted deposition of films such as diamond over a large area without requiring heating external to the plasma itself.

9 Claims, 2 Drawing Sheets

SPIRAL HOLLOW CATHODE

This invention relates to a spiral hollow cathode used to produce large area electron beams and plasmas. The cathode is particularly well-suited for deposition of high quality diamond films on substrates.

BACKGROUND OF THE INVENTION

The remarkable chemical and physical properties of diamond films make them excellent materials for a broad range of scientific and industrial applications. A number of chemical vapor deposition (CVD) techniques have been proposed and have proven to be feasible for growing polycrystalline diamond films from mixtures of methane or other carbon-containing gases with hydrogen or oxygen. In accordance with these techniques, the reactive species are produced by decomposing the gas mixtures either thermally by means of hot filaments or kinetically using hot electrons in a cold plasma or both electrons and ions in a thermal plasma. For example, an article by Singh, Mesker, Levine, and Arie, *Hollow Cathode Plasma Assisted Chemical Vapor Deposition of Diamond*. 52 Applied Physics Letters 1658 (May 16, 1988), incorporated herein by reference, discloses a diamond deposition method utilizing a hot hollow cathode which combines both thermal and plasma dissociation of reactant gases. Neither this nor any other existing technique, however, combines the thermal and kinetic processes to produce large area electron beams and plasmas and achieve uniform deposition of diamond films.

In addition, other hollow cathodes have been designed, including a 6 mm diameter open tantalum tube and a 6 mm diameter molybdenum tube having a 3 mm diameter thermally-isolated tantalum insert and a 1 mm diameter aperature. These tubes lack low impedance plasma characteristics, however, and therefore require relatively high voltages for ignition and operation at a specified current. These prior designs also cannot be scaled readily to achieve large area electron beams and plasmas.

SUMMARY OF THE INVENTION

In contrast to existing designs, the present invention consists of a simple, economical, and effective spiral hollow cathode plasma CVD apparatus and technique based on combined plasma, electron beam, and hot-filament mechanisms. The apparatus includes a novel spiral hollow cathode, an anode holding a substrate, and utilizes an electrical power supply to initiate a plasma from a gas mixture. Important features of the invention include (i) high gas decomposition and electrical power efficiency which can be achieved because of the combined mechanisms and the flow of process gases through the hot spiral cathode; (ii) convenient low-voltage operation (less than 300 V for ignition and approximately 100 V for sustaining the discharge) is possible; (iii) the spiral hollow cathode, which is equivalent to a two-dimensional array of small tube hollow cathodes, is suitable for producing large area electron beams and plasmas and uniform deposition of films such as diamond; and (iv) no external heating besides the plasma itself is needed. The cathode acts as a continuous microcathode, so that once the plasma ignites in one place it heats surrounding areas and forces uniform ignition over the entire region. According to results obtained through scanning electron microscopy, Raman spectroscopy, and x-ray diffraction characterization, high quality diamond films may be created using the novel cathode.

It is therefore an object of the present invention to provide a spiral hollow cathode and accompanying apparatus which will produce large area electron beams and plasmas.

It is an additional object of the present invention to provide an apparatus suitable for electron and plasma-aided deposition, surface modification, and large area diamond deposition.

It is yet an additional object of the present invention to provide an apparatus which operates at low voltages and achieves increased electrical power efficiency in producing large area electron beams and plasmas and depositing films.

It is a further object of the present invention to provide an apparatus which achieves high gas decomposition and requires no heating external to the plasma if desired.

Other objects, features, and advantages of the present invention will become apparent with reference to the remainder of the written portion and the drawings of this application.

DETAILED DESCRIPTION OF THE DRAWINGS

Figure 1:
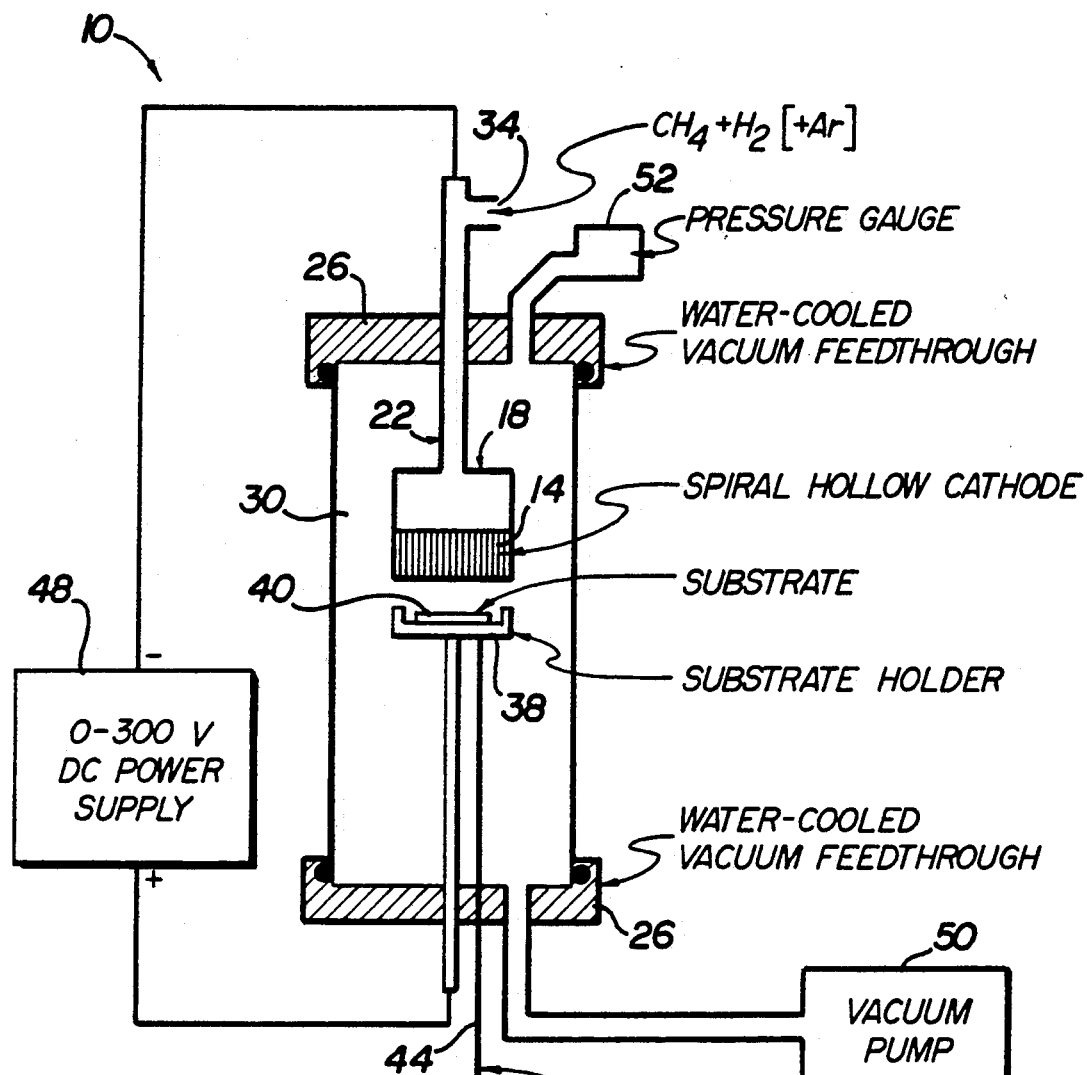
FIG. 1 is a schematic representation of the apparatus of the present invention.

FIG. 1 details the electron beam and plasma production and deposition apparatus 10 of the present invention. A metal foil is wound into a spiral shaped cathode 14 (FIGS. 1 and 2) and inserted into a cylinder 18. Tubing 22 connects cylinder 18 with a vacuum fitting or water-cooled vacuum feedthrough 26 at the upper end of a reactor vessel 30 in which the deposition occurs. A gas mixture 34 flows through the fitting 26 and tubing 22 into cylinder 18. The gas mixture 34 subsequently flows through the spaces between adjacent layers of the spiral cathode 14 toward the anode 38 holding substrate 40.

A thermocouple 44 may be imbedded in the anode 38 for measuring its temperature. Power supply 48, typically supplying 0–300 VDC, is used for initiating the plasma 49. A second vacuum fitting or water-cooled vacuum feedthrough 26 at the lower end of the reactor vessel 30 allows the apparatus 10 to be connected to a vacuum pump 50 to eliminate unwanted air from the reactor vessel. Apparatus 10 also may include a pressure gauge 52 for measuring the pressure in the vessel 30.

In a preferred embodiment cylinder 18 is made of molybdenum with a diameter of approximately 12.7 mm. Tubing 22 typically is stainless steel and may be welded to vacuum fitting 26, which itself may be a water-cooled compression vacuum fitting. Reactor vessel 30 may be a quartz tube having a primary diameter of two inches and upper and lower ends of one inch diameter to engage fittings 26, while anode 38 typically is made of graphite.

A typical process gas mixture 34 includes approximately 0.5–1% methane and approximately 99.5–99% hydrogen. Argon is added to the gas mixture 34 to lower the voltage needed for hollow cathode plasma initiation allowing a high-density plasma 49 to be initiated merely by applying 250 VDC from power supply 48 to the anode 38 with the cathode 14 connected to electrical ground. Once the plasma 49 is initiated, the spiral cathode 14 is heated by the ion bombardment to reach a high temperature for thermionic emission of electrons. These electrons are confined inside the spiral cathode 14 for a period of time before being accelerated to the anode 38. The electron confinement produces the hollow cathode effect between adjacent layers of the spiral cathode 14, generates a high electron density around the cathode 14, and subsequently induces and sustains a high-current, low-voltage discharge. The substrate 40 positioned on the anode 38 is heated simultaneously by the hot spiral cathode 14 and the high current of electrons to raise its temperature sufficiently for diamond deposition. Besides heating the substrate 40, electron bombardment has also been reported to enhance the diamond nucleation.

Both semiconducting silicon and insulating sapphire may be used as the substrate 40. Polishing substrate 40 with diamond powder is found to help diamond nucleation but is not a requirement for growing diamond films. Diamond particles nucleated on the substrate 40 grow larger as deposition proceeds and finally coalesce to form a diamond film. Similar diamond growth phenomena are observed on silicon and sapphire. Diamond films adhere to silicon substrates very well and thin films also adhere well to sapphire substrates. Due to the large difference in the temperature coefficients of expansion between diamond films and sapphire substrates, however, continuous diamond films crack and peel from the sapphire substrates relatively easily and form smaller pieces of free-standing diamond films.

Figure 2:
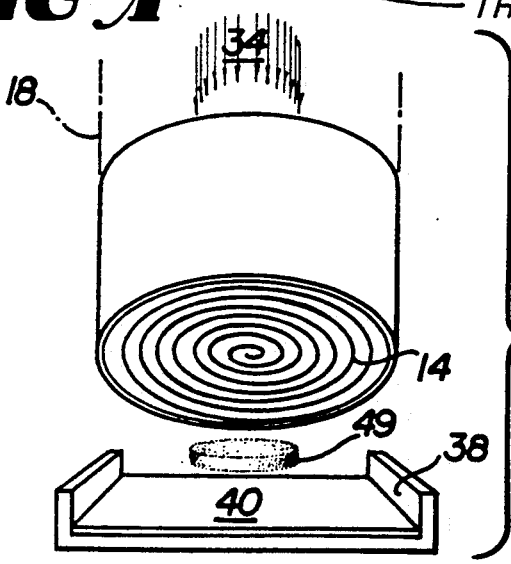
FIG. 2 is a perspective view of the spiral hollow cathode represented in FIG. 1.

FIG. 2 is a perspective view of the spiral hollow cathode 14 of the present invention positioned above a substrate 40. Cathode 14 typically is composed of an electron emissive refractory foil such as tungsten, tantalum, or molybdenum. In a preferred embodiment cathode 14 is made of tantalum foil approximately 0.08 mm thick, 10 mm wide, and 150 mm long, with the separation between layers equal to approximately 0.5 mm. As is readily apparent, however, the geometry, dimensions and optimal characteristics of cathode 14 are highly dependent on the function it must perform, and spiral-shaped cathodes may be fabricated in accordance with the present invention of any thickness, width and length and having any separation between layers necessary to achieve desired results. For example, separations between layers of approximately 65 mm or thicknesses as large as 0.25 mm may be useful for certain depositions, while separations and thicknesses of approximately 0.025 mm may be utilized in other cases. Alternatively, a thicker material may be used and thinned at the emittive end to produce few spirals and allow only a small amount of gas flow. Spacers also may be used to separate adjacent layers of cathode 14. Inserting a 0.025 mm thick, 10 mm wide, and 150 mm long tantalum spiral into prior designs such as the 6 mm diameter open tube cathode lowers the required ignition and current-maintenance voltages and stabilizes operation of that device. Similarly, insertion of a miniature spiral cathode made of a tightly wound roll of 0.13 mm thick, 3 mm wide tantalum into the 1 mm aperature of the other prior design mentioned earlier and enlargement of the 1 mm aperature to 2 mm results in improved stability and efficiency of operation.

Figure 3:
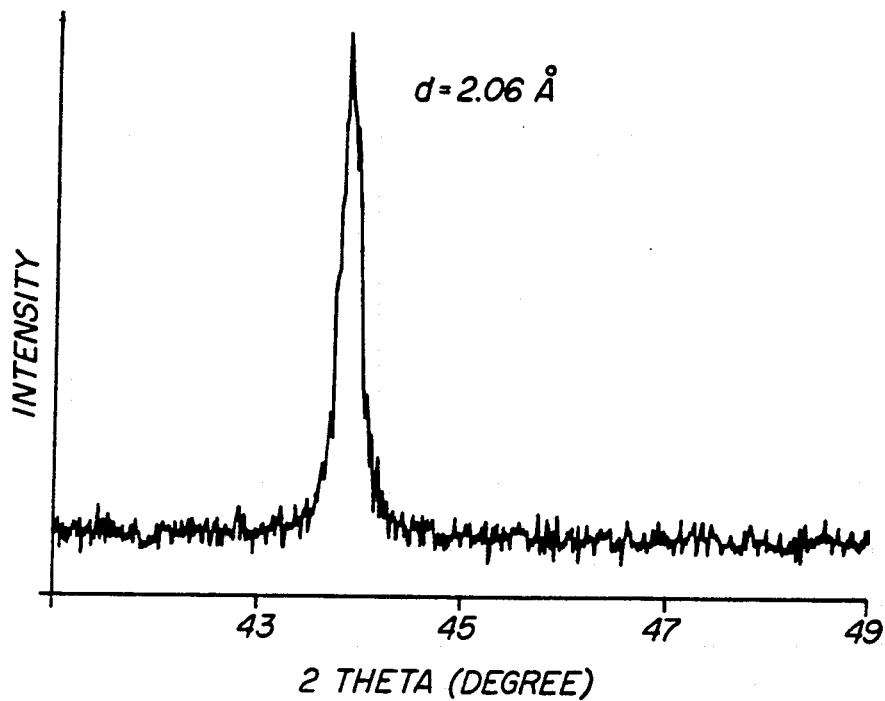
FIG. 3 is a graphical representation of the x-ray diffraction pattern for a free-standing diamond film deposited on a substrate using the apparatus represented in FIG. 1.
Figure 4:
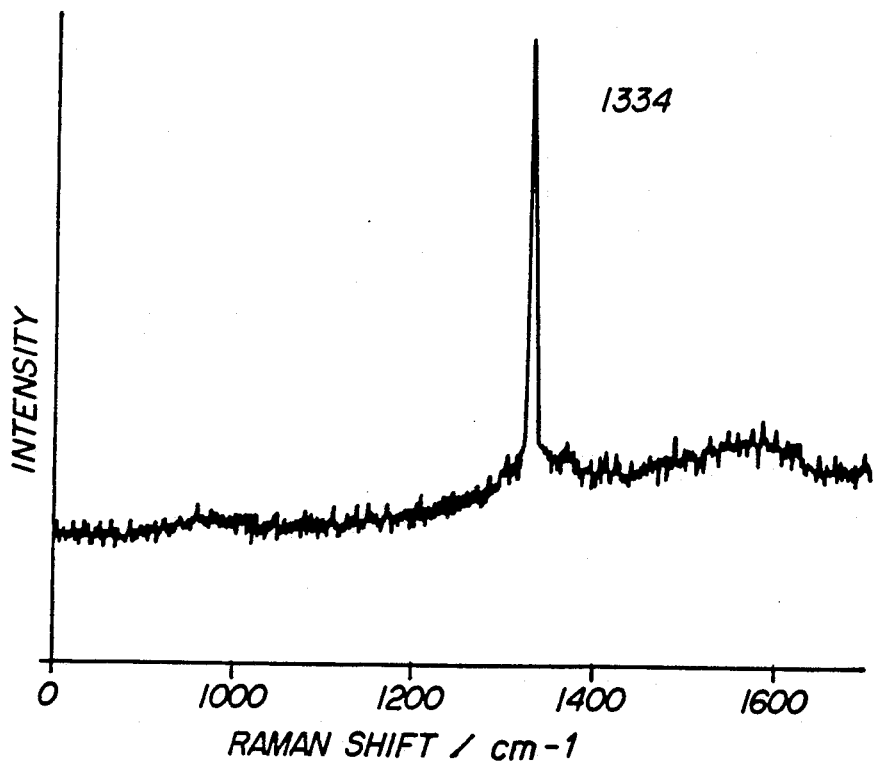
FIG. 4 is a graphical representation of the Raman spectroscopy spectrum for a diamond film deposited on a substrate using the apparatus represented in FIG. 1.

FIGS. 3 and 4 detail pertinent characteristics of diamond films deposited in accordance with the present invention. The x-ray diffraction (XRD) peak shown in FIG. 3 corresponding to a lattice spacing of 2.06 A is consistent with the diamond standard. The Raman spectrum shown in FIG. 4 has a sharp peak at 1334 cm$^{-1}$ corresponding to the diamond structure. Since the Raman scattering efficiency for graphite is two orders of magnitude higher than diamond, FIG. 4 demonstrates that little or negligible graphite is present in the diamond films.

The foregoing is provided for purposes of illustration, explanation, and description of a preferred embodiment of the invention. Modifications and adaptations to this embodiment will be apparent to those of ordinary skill in the art and they may be made without departing from the scope or spirit of the invention.

What is claimed is:

1. An apparatus for generating uniform electron beams and plasmas over a large area comprising a hollow cathode having a spiral shape and capable of being heated to electron emission temperature without direct use of resistive heating.

2. An apparatus according to claim 1 in which the cathode is composed of a metal selected from the group consisting of tungsten, tantalum, and molybdenum.

3. An apparatus according to claim 2 in which the metal composing the cathode is approximately 0.08 mm thick, 10 mm wide, and 150 mm long.

4. An apparatus according to claim 1 and further comprising:
 a. a cylinder for receiving the cathode;
 b. a gas mixture for flowing through the layers of the cathode;
 c. an anode toward which the electrons in the electron beams are emitted; and
 d. a vessel for containing the cylinder, anode, and gas mixture.

5. An apparatus according to claim 4 further comprising a substrate positioned on the anode for receiving the emitted electrons.

6. An apparatus according to claim 1 in which the cathode is heated by a plasma created in a gas.

7. An apparatus according to claim 6 in which the cathode is electrically biased.

8. An apparatus according to claim 6 in which the cathode permits a plasma initiated at one point relative to the cathode to spread about the entire cathode.

9. An apparatus for generating uniform electron beams and plasmas over a large area comprising:
 a. a cathode having a spiral shape in which spaces approximately 0.5 mm wide exist between adjacent layers and composed of a metal approximately 0.08 mm thick, 10 mm wide, and 150 mm long selected from the group consisting of tungsten, tantalum, and molybdenum;
 b. a cylinder for receiving the cathode;
 c. a gas mixture for flowing through the layers of the cathode;
 d. an anode toward which the electrons in the electron beams are emitted;
 e. a thermocouple imbedded in the anode for measuring its temperature;

f. a substrate positioned on the anode for receiving the emitted electrons;
g. a vessel for containing the cylinder, anode, and gas mixture;
h. means for eliminating unwanted air from the vessel; and
i. a pressure gauge for measuring the pressure inside the vessel.

* * * * *